US008108960B2

United States Patent
Hashimoto et al.

(10) Patent No.: US 8,108,960 B2
(45) Date of Patent: Feb. 7, 2012

(54) PARTICLE REMOVING MEMBER OF SUBSTRATE PROCESSING EQUIPMENT

(75) Inventors: Koichi Hashimoto, Ibaraki (JP); Yoshio Ota, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 2209 days.

(21) Appl. No.: 11/063,546

(22) Filed: Feb. 24, 2005

(65) Prior Publication Data

US 2005/0186428 A1  Aug. 25, 2005

(30) Foreign Application Priority Data

Feb. 25, 2004 (JP) .............................. P. 2004-050028

(51) Int. Cl.
*B08B 7/00* (2006.01)
(52) U.S. Cl. .................... 15/104.002; 134/201; 15/3
(58) Field of Classification Search ................ 134/1, 6, 134/19, 42, 94.1, 902; 15/3, 97.1, 102, 104.002, 15/246; 428/40.1, 343, 354
See application file for complete search history.

(56) References Cited

U.S. PATENT DOCUMENTS

| | | | |
|---|---|---|---|
| 5,753,563 A * | 5/1998 | Guan et al. ..................... | 438/476 |
| 6,149,992 A | 11/2000 | Nakayama et al. | |
| 6,495,379 B2 | 12/2002 | Iketani | |
| 6,538,093 B2 * | 3/2003 | Sugo et al. ....................... | 528/28 |
| 6,773,808 B2 * | 8/2004 | Ogawa et al. .................. | 428/349 |
| 2002/0045348 A1 * | 4/2002 | Arai ............................... | 438/690 |
| 2005/0104147 A1 * | 5/2005 | Krywanczyk et al. ........ | 257/431 |

FOREIGN PATENT DOCUMENTS

| | | |
|---|---|---|
| JP | 10-154686 A | 6/1998 |
| JP | 11-087458 A | 3/1999 |
| JP | 2002-302659 A | 10/2002 |
| JP | 2003-112128 A | 4/2003 |
| KR | 1999-077357 A | 10/1999 |
| KR | 2002-0011910 A | 2/2002 |

OTHER PUBLICATIONS

Chinese Office Action dated Jun. 1, 2007, English translation.
Korean Office Action dated Nov. 14, 2008.
Korean Office Action dated May 1, 2009.

* cited by examiner

*Primary Examiner* — Michael Kornakov
*Assistant Examiner* — Nicole Blan
(74) *Attorney, Agent, or Firm* — Sughrue Mion, PLLC

(57) ABSTRACT

The present invention intends to provide a particle removing member of a substrate processing equipment which can be assuredly conveyed into the substrate processing equipment and can conveniently and assuredly remove an adhered foreign matter, and a particle removing method of a substrate processing equipment that uses the particle removing member.

A particle removing member of a substrate processing equipment comprising a particle removing layer in which a time necessary for a signal intensity of free induction decay measured by a pulse NMR-Solid Echo method to decay to 37% of an initial value at a measurement temperature of 100 degrees centigrade is 1000 µs or less, in particular, a particle removing sheet comprising the above-constituted particle removing layer on a support, and a conveying member with particle removing function formed by adhering the above-constituted particle removing sheet on the conveying member, and furthermore a method of removing particle of a substrate processing equipment, comprising conveying the above-constituted conveying member with particle removing function into a substrate processing equipment.

5 Claims, No Drawings

PARTICLE REMOVING MEMBER OF SUBSTRATE PROCESSING EQUIPMENT

FIELD OF THE INVENTION

The present invention relates to a particle removing member of a substrate processing equipment that is typical in a device for manufacturing or inspecting semiconductors, flat panel displays or printed-circuit boards and abhors foreign matters, and a method of removing particle from the substrate processing equipment by use of the particle removing member.

BACKGROUND ART

In a substrate processing equipment, a substrate is conveyed in physical contact with a conveyer system. At this time, when foreign matters are adhered to the substrate or the conveyer system, subsequent substrates are successively contaminated. Accordingly, it is necessary to periodically stop the equipment to cleanse. As a result, there are problems in that the operation rate is lowered and much labor becomes necessary.

In order to overcome these problems, there have been proposed a method according to which method a substrate to which an adhesive matter is fastened is conveyed in a substrate processing equipment to remove foreign matters adhered to the inside of the substrate processing equipment (patent document 1) and a method according to which a planar member is conveyed into a substrate processing equipment to remove foreign matters adhered to a back surface of the substrate (patent document 2).
[Patent Document 1]
    JP-A-10-154686 (pages 2 to 4)
[Patent Document 2]
    JP-A-11-87458 (pages 2 to 3)

SUMMARY OF THE INVENTION

Among the proposed methods, a method in which a substrate to which an adhesive material is fixed is conveyed to remove foreign matters adhered to the inside of the substrate processing equipment is the most effective method. However, according to the method, in some cases, the adhesive material and a contact portion of the processor come to adhere very strongly to be difficult to peel, and the substrate cannot be assuredly conveyed. In particular, in the case of a sucking mechanism being used in a chuck table of a substrate processing equipment, the above problems are conspicuous.

The present invention, in view of these circumstances, intends to provide a particle removing member of a substrate processing equipment that can be assuredly conveyed inside of the substrate processing equipment and can conveniently and assuredly remove adhered foreign matters, and a method of removing particle from the substrate processing equipment by use of the particle removing member.

The present inventors, in order to overcome the above problems, studied hard about a particle removing layer of a particle removing member that is conveyed inside of a substrate processing equipment and obtained findings as mentioned below.

Almost all organic substances have a hydrogen atom in molecules thereof. When the hydrogen atom is inhibited from freely moving, the motility of surrounding molecule can be inhibited as well.

In this connection, when the hydrogen atom in the particle removing layer is limited in the motility and the particle removing layer is formed of molecule low in the motility, the particle removing layer becomes difficult to follow fine irregularities of such as a chuck table or a conveyer arm of the substrate processing equipment. As a result, the particle removing layer does not come into strong contact with a contact portion of the substrate processing equipment, resulting in causing less abnormal noise and smoothly conveying.

The motility of a hydrogen atom can be measured by investigating by means of a pulse NMR method a spin-spin relaxation time when a hydrogen nucleus excited in a static magnetic field returns to an original state. When the relaxation time is shorter, the motility of the hydrogen atom, consequently the motility of a molecule becomes lower, and when it is longer the motility becomes higher.

The relaxation time of the particle removing layer can be most preferably measured by use of a Solid Echo method that is applied to a molecule relatively low in the motility. A measurement (observation) temperature is preferably in the neighborhood of 100° C. (degrees centigrade) because when it is 50° C. or less the molecular motility can be discriminated with difficulty.

The present inventors, based on the above considerations, investigated in detail the spin-spin relaxation time of the particle removing layer. As a result, it was found that, as the most preferable value, when a time during which a signal intensity of free induction decay relaxes to 37% of an initial value at a measurement temperature of 100° C., that is, a time necessary for decaying to 37% of the initial value was constituted so as to be 1000 μs or less, a particle removing layer low in the motility could be realized, and thereby, without coming into strong contact with a contact portion of the substrate processing equipment, could be smoothly conveyed without causing abnormal noise.

Thus, the present inventors limited the motility of the hydrogen atoms present in the particle removing layer and thereby constituted the particle removing layer with molecules low in the motility. Thereby, it was found that the particle removing member that does not trace fine irregularities of such as a chuck table or a transfer arm of the substrate processing equipment, does not come into solid contact with a contact portion, and can be smoothly conveyed without causing abnormal noise could be obtained; and when the particle removing member is conveyed into the substrate processing equipment, foreign matters adhered to the inside of the device could be conveniently and assuredly removed. As a result, the present invention came to completion.

That is, the present invention relates to a particle removing member of a substrate processing equipment, which comprises a particle removing layer in which a signal intensity of free induction decay measured according to a pulse NMR-Solid Echo method takes 1000 μs or less to decay to 37% of an initial value thereof at a measurement temperature of 100° C.

In particular, the invention can provide a particle removing sheet comprising a particle removing layer having the above configuration on a support and a conveying member which is formed by adhering a particle removing sheet having the above configuration on a conveying member and has particle removing function.

Furthermore, the invention relates to a method of removing particle of a substrate processing equipment in which a conveying member constituted as mentioned above and having the particle removing function is conveyed into a substrate processing equipment.

A time obtained according to the Solid Echo method means a $T_2$ relaxation time (spin-spin relaxation time), normally can be obtained by mathematically applying the least square fitting to a free induction decay (FID) curve by use of a computer, and when the Weibull coefficient (E) is 1, can be obtained as a time during which a signal intensity decays to 37% of an initial value.

As an analytical method thereof, it is detailed in, for instance, I. Ando, *Solid NMR of Polymer*, Kodansha Scientific, p. 29 to 35, 1994.

Thus, in the invention, the motility of a hydrogen atom present in a particle removing layer is limited and thereby the particle removing layer is formed of molecules low in the motility. Accordingly, a particle removing member of a substrate processing equipment that can be assuredly conveyed inside of the substrate processing equipment and conveniently and assuredly remove adhered foreign matters, and a particle removing method of a substrate processing equipment that uses the particle removing member can be provided.

BEST MODE FOR CARRYING OUT THE INVENTION

In a particle removing layer in the invention, a time during which a signal intensity of free induction decay measured at a measurement temperature of 100° C. according to a pulse NMR-Solid Echo method decays to 37% of an initial value is 1000 µs or less.

Thereby, the particle removing layer, without coming into solid contact with a contact portion of a substrate processing equipment and causing abnormal noise, can be conveyed into a substrate processing equipment and effectively remove foreign matters adhered to the inside of the equipment. In order to more effectively exhibit the effect, the relaxation time is preferably 800 µs or less, and more preferably 400 µs or less.

In such a particle removing layer, a material thereof is not particularly restricted. For instance, in applications where the heat-resistance is necessary, polyimide can be preferably used. Furthermore, ones in which curable adhesives that can be polymerized owing to active energy sources such as UV, electron beam, and heat are polymerized and hardened with the above energy sources, and thereby the adhesiveness thereof is remarkably lowered are preferable.

At the polymerizing and hardening, by controlling an amount of the active energy source, for instance, in the case of a UV-curable adhesive, by controlling an integrated UV quantity, in addition, as needs arise, by controlling an amount of a photopolymerization initiator used, the motility of hydrogen atoms after the polymerization and hardening can be controlled, and thereby the relaxation time can be easily set in a predetermined range.

The curable adhesive used here may be any one as far as it is polymerized and hardened with an active energy source to form a molecular structure having a three-dimensional network. Normally, one in which a polymerizing unsaturated compound having two or more unsaturated double bonds in a molecule and a polymerization initiator are contained in a pressure-sensitive adhesive polymer can be preferably used.

As the pressure-sensitive adhesive polymer, an acrylic polymer which has (meth)acrylic acid or (meth)acrylate ester as a primary monomer can be preferably used. At the synthesis of the polymer, by introducing an unsaturated double bond in a polymer molecule by use of a compound that has two or more unsaturated double bonds in a molecule as a copolymerizing monomer, or by chemically bonding according to a reaction between functional groups a compound which has an unsaturated double bond in a molecule to a polymer after synthesis, thereby the polymer as that may be involved in the polymerization and hardening reaction.

As the polymerizing unsaturated compound, a low molecular weight body which is non-volatile and has an weight-average molecular weight of 10,000 or less is preferable, and one having a molecular weight of 5000 or less is preferable from a viewpoint of efficiently forming a three-dimensional network at the curing.

Specific examples of such polymerizing unsaturated compound include phenoxypolyethylene glycol (meth)acrylate, γ-caprolactam (meth)acrylate, polyethylene glycol di(meth)acrylate, polypropylene glycol di(meth)acrylate, trimethylol propane tri(meth)acrylate, dipentaerythritol hexa(meth)acrylate, urethane (meth)acrylate, epoxy (meth)acrylate and oligoester (meth)acrylate. At least one kind thereof is used.

As the polymerization initiator, when heat is used as the active energy source, thermal polymerization initiators such as benzoyl peroxide and azobisisobutylonitrile can be used, and when light is used, photopolymerization initiators such as benzoyl, benzoin ethyl ether, dibenzyl, isopropyl benzoin ether, benzophenone, Michler's ketone chlorothioxanthone, dodecylthioxanthone, dimethylthioxanthone, acetophenone diethyl ketal, benzil dimethyl ketal, α-hydroxycyclohexylphenyl ketone, 2-hydroxymethyl phenylpropane and 2,2-dimethoxy-2-phenyl acetophenone can be used.

Thus constituted curable adhesive can be compounded with, other than the above ingredient as indispensable ingredient, in order to control the coagulating properties as the particle removing layer, as needs arise, various kinds of crosslinking agents such as isocyanate-base and epoxy-base. Furthermore, further as needs arise, various kinds of known additives that are normally compounded with the adhesive may be compounded.

The particle removing member according to the invention may be formed into a conveying member with the particle removing function by providing the particle removing layer on one or both surfaces of the conveying member. However, more preferably, on one surface of a support the particle removing layer is disposed to form a particle removing sheet, the particle removing sheet is adhered on one or both surfaces of the conveying member, and thereby a conveying member with the particle removing function may be formed. A thickness of the particle removing layer, though not particularly restricted, in consideration of the transferability, is normally preferable to be 5 to 100 µm.

As the support, plastic films made of such as polyolefins such as polyethylene, polypropylene, polybutene, polybutadiene, and polymethylpentene; polyvinyl chloride; vinyl chloride copolymer; polyethylene terephthalate; polybutylene terephthalate; polyurethane; ethylene-vinyl acetate copolymer; ionomer resin; ethylene/(meth)acrylic acid copolymer; ethylene/(meth)acrylate ester copolymer; polystyrene; and polycarbonate can be cited.

These supports may be used singularly or in combinations of at least two kinds, and furthermore, one or both surfaces thereof may be processed by corona discharge. A thickness of a support is normally preferably set in the range of 10 to 100 µm.

When a particle removing layer is disposed on one surface of a support to form a particle removing sheet, it is desirable to dispose an adhesive layer on an opposite surface of the support and, by making use of the adhesiveness thereof, to adhere to a conveying member.

In the adhesive layer, ordinary adhesives such as acryl-base, rubber-base or silicone-base can be properly used. Furthermore, a thickness of the adhesive layer, though not particularly restricted, is normally set in the range of 5 to 100 µm, and preferably in the range 10 to 50 µm.

On the particle removing layer and the adhesive layer, a protective film is desirably laminated up to the use of the particle removing sheet.

As the protective film, plastic films made of such as polyolefins such as polyethylene, polypropylene, polybutene, polybutadiene, and polymethylpentene; polyvinyl chloride; vinyl chloride copolymer; polyethylene terephthalate; polybutylene terephthalate; polyurethane; ethylene-vinyl acetate copolymer; ionomer resin; ethylene/(meth)acrylic acid copolymer; ethylene/(meth)acrylate ester copolymer; polystyrene; and polycarbonate, all of which are release-treated with a release agent such as a silicone-base, a long chain alkyl-base, a fluorinated, an aliphatic amide-base or a silica-base release agent, can be cited.

A thickness of the protective film, from the viewpoint of the workability, is normally preferable to be in the range of 10 to 100 μm.

In the invention, the conveying member is not restricted to particular one; however, a semiconductor wafer, a substrate for flat panel display such as LCD and PDP, and a substrate for compact disc and MR head can be cited.

EXAMPLES

In what follows, the present invention will be detailed based on examples. However, the present invention is not restricted only to examples below. Parts below mean "parts by weight".

Example 1

50% by weight toluene solution comprising 25 parts of 2-ethylhexyl acrylate, 75 parts of ethyl acrylate, 5 parts of methyl methacrylate, 5 parts of 2-hydroxyethyl acrylate, and 0.2 parts of benzoyl peroxide was polymerized, and thereby an acrylic polymer having an average molecular weight of substantially 400,000 was synthesized.

To 100 parts (solid content) of the acrylic polymer, 200 parts of neopentyl glycol dimethacrylate, 5 parts of a isocyanate compound (trade name; Colonate L, manufactured by Nippon Polyurethane Industry Co., Ltd.) as a crosslinking agent and 5 parts of a photopolymerization initiator (trade name; Irugacure 651, manufactured by Chiba Specialty Chemicals Inc.) were added followed by thoroughly blending, and thereby a UV-curable adhesive was prepared.

Separately from the above, 70% by weight toluene solution comprising 100 parts of butyl acrylate, 5 parts of acrylic acid and 0.2 parts of benzoil peroxide was polymerized, and thereby an acrylic polymer having an average molecular weight of substantially 600,000 was synthesized.

To 100 parts (solid content) of the acrylic polymer, 5 parts of an isocyanate compound (trade name; Colonate L, manufactured by Nippon Polyurethane Industry Co., Ltd.) was added as a crosslinking agent, followed by thoroughly blending, and thereby an adhesive was prepared.

The adhesive was coated on a release-treated polyester film so as to be 15 μm as a dry thickness and dried, and thereby an adhesive layer was formed.

Next, by use of a polyester film having a thickness of 25 μm as a support, on one surface of the support, the UV-curable adhesive was coated so as to be 15 μm as a dry thickness, followed by drying, and thereby a UV-curable adhesive layer was formed. On a surface of the layer, the release-treated polyester film was laminated as a protective film. Furthermore, on an opposite surface of the support, the adhesive layer formed according to the above method was laminated, and thereby a 5-layer structure laminate sheet having the release-treated polyester film on both sides was obtained.

Subsequently, on the laminate sheet, from a side of the UV-curable adhesive layer, UV-light having a center wavelength of 365 nm was illuminated so as to be 2,000 mJ/cm$^2$ as integrated light quantity, and thereby the UV-curable adhesive layer was polymerized and cured.

Thereby, a particle removing sheet with the particle removing layer made of the polymerized and cured UV-curable adhesive layer on one surface of the support, the adhesive layer on the opposite surface of the support and the release-treated polyester films on both layers as the protective film was prepared.

Of the particle removing layer made of the polymerized and cured UV-curable adhesive layer of the particle removing sheet, according to the following procedure, a time necessary for a signal intensity of free induction decay measured according to a pulse NMR-Solid Echo method to decay to 37% of an initial value at a measurement temperature of 100° C. was measured and found to be 50 μs.

(Measurement Method of Relaxation Time)

In a test tube, a sample of the particle removing layer was inserted up to a depth of substantially 2 cm, followed by mounting on an analyzer, further followed by holding for 1 to 10 min so that a temperature inside of the sample may be uniform, and measurement was carried out under conditions below. A time during which a signal of free induction decay obtained according to the method becomes 37% of an initial value was obtained.

Pulse NMR Analyzer: trade name "JNM-MU25" manufactured by JEOL. Ltd.
Observed nucleus: Proton
Resonance frequency: 25 MHz
Measurement Mode: Solid-Echo Method
Measurement Temperature: 100° C.
900 Pulse Width: 2.0 μs
Pulse interval: 8.0 μs
Retrieving Time: 2.0 s
Number of Times of Integration: 16 times

Example 2

Except for an integrated light quantity being set at 700 mJ/cm$^2$, the UV polymerization and hardening of the UV-curable adhesive were carried out similarly to example 1, and thereby a particle removing sheet was prepared. Of a particle removing layer made of the polymerized and cured UV-curable adhesive layer, similarly to the above, a relaxation time thereof was measured and found to be 130 μs.

Example 3

Except for an integrated light quantity being set at 400 mJ/cm$^2$, the UV polymerization and hardening of the UV-curable adhesive were carried out similarly to example 1, and thereby a particle removing sheet was prepared. Of a particle removing layer made of the polymerized and cured UV-curable adhesive layer, similarly to the above, a relaxation time thereof was measured and found to be 220 μs.

Comparative Example 1

Except for an integrated light quantity being set at 150 mJ/cm$^2$, the UV polymerization and hardening of the UV-curable adhesive were carried out similarly to example 1, and thereby a particle removing sheet was prepared. Of a particle removing layer made of the polymerized and cured UV-curable adhesive layer, similarly to the above, a relaxation time thereof was measured and found to be 1200 μs.

Comparative Example 2

Except for an integrated light quantity being set at 50 mJ/cm$^2$, the UV polymerization and hardening of the UV-curable adhesive were carried out similarly to example 1, and thereby a particle removing sheet was prepared. Of a particle removing layer made of the polymerized and cured UV-curable adhesive layer, similarly to the above, a relaxation time thereof was measured and found to be 2000 μs.

With each of the respective particle removing sheets according to Examples 1 to 3 and Comparative Examples 1 and 2, a release film on the adhesive layer on a side opposite to the particle removing layer is peeled, an 8-inch silicon wafer is adhered on a mirror surface thereof as a conveying member, a periphery portion thereof is arranged into a wafer shape, a release film on the particle removing layer is peeled, and thereby a conveying member with particle removing function was prepared.

Thus obtained conveying members were evaluated of the transportability according to the procedure below. Results are as shown in Table 1. In Table 1, for reference, the relaxation times of the particle removing layers are shown together.
(Evaluation of the Transportability of Conveying member with Particle removing Function)

As an adhesive tape laminating machine, "DR-8500 II" manufactured by NITTO SEIKI INC was used and a table temperature was set at 35° C. When, with the particle removing layer directed downward, the conveying member with the particle removing function was conveyed, abnormal noise generated when the conveying member was once sucked by a chuck table and released again was confirmed.

When the abnormal noise such as "pang" was observed at the release, it was evaluated as "bad" in the transportability, and when the abnormal noise "pang" was not utterly heard, it was evaluated as "excellent" in the transportability.

TABLE 1

|  | Relaxation Time (μs) | Transportability (presence of abnormal noise) |
| --- | --- | --- |
| Example 1 | 50 | Excellent (no abnormal noise) |
| Example 2 | 130 | Excellent (no abnormal noise) |
| Example 3 | 220 | Excellent (no abnormal noise) |
| Comparative Example 1 | 1200 | Bad (abnormal noise) |
| Comparative Example 2 | 2000 | Bad (abnormal noise) |

As obvious from the results of Table 1, the conveying members with the particle removing function according to examples 1 through 3 that are constituted according to the present invention are found to be superior in the transportability to the conveying members with the particle removing function according to comparative examples 1 and 2 that are not constituted according to the invention.

Separately from this, when the conveying members with the particle removing function according to examples 1 through 3 were actually used to convey into a substrate processing equipment for use in 8-inch silicon wafer to remove foreign matters adhered to the inside of the processor, it was also found that the foreign matters could be simply and assuredly removed.

While the invention has been described in detail and with reference to specific embodiments thereof, it will be apparent to one skilled in the art that various changes and modifications can be made therein without departing from the scope thereof.

This application is based on Japanese patent application No. 2004-50028 filed on Feb. 25, 2004, the entire contents thereof being hereby incorporated by reference.

What is claimed is:

1. A particle removing member of a substrate processing equipment, which comprises a particle removing sheet comprising a particle removing layer in which a time necessary for a signal intensity of free induction decay measured by a pulse NMR-Solid Echo method to decay to 37% of an initial value at a measurement temperature of 100° C. is 1000 μs or less and a support,
   a conveying member,
   wherein the particle removing sheet is adhered to the conveying member via an adhesive.

2. The particle removing member according to claim 1, wherein the particle removing layer comprises polyimide.

3. The particle removing member according to claim 1, wherein the particle removing layer comprises a curable adhesive hardened with an active energy source.

4. The conveying member with particle removing function according to claim 1, wherein the conveying member is a semiconductor wafer, a substrate for a flat panel display, or a substrate for a compact disc or MR head.

5. The conveying member with particle removing function according to claim 1, wherein the conveying member is a semiconductor wafer.

* * * * *